United States Patent [19]

Ishimoto

[11] Patent Number: 5,568,056
[45] Date of Patent: Oct. 22, 1996

[54] WAFER PROBER

[75] Inventor: Takashi Ishimoto, Mitaka, Japan

[73] Assignee: Tokyo Seimitsu Co., Ltd., Tokyo, Japan

[21] Appl. No.: 348,893

[22] Filed: Nov. 25, 1994

[30] Foreign Application Priority Data

Dec. 16, 1993 [JP] Japan .................... 5-316758

[51] Int. Cl.$^6$ .................................... G01R 31/02
[52] U.S. Cl. ........................ 324/754; 324/158.1
[58] Field of Search .................. 324/754, 158.1; 74/104, 516; 188/321.11; 267/64.26

[56] References Cited

U.S. PATENT DOCUMENTS

| | | | |
|---|---|---|---|
| 4,638,680 | 1/1987 | Albrecht | 74/104 |
| 4,667,155 | 5/1987 | Coiner et al. | |
| 4,812,754 | 3/1989 | Tracey et al. | |
| 4,875,005 | 10/1989 | Terada et al. | 324/754 |
| 5,489,853 | 2/1996 | Nakajima | 324/754 |

FOREIGN PATENT DOCUMENTS 2-74050  3/1990  Japan .

Primary Examiner—Ernest F. Karlsen
Assistant Examiner—Russell M. Kobert
Attorney, Agent, or Firm—Oliff & Berridge

[57] ABSTRACT

A test head is rotatably supported by a main body of device. This test head is rotatable between an inspecting position electrically connected to a probe card and a retracted position being retracted from the inspecting position. The test head is connected thereto with a cylinder for weight balance for decreasing the tare of the test head, and the center of rotation of the connecting point of the cylinder for weight balance is made eccentric from the center of rotation of the test head. With this arrangement, the balancing force of the cylinder for weight balance can be rendered to the test head without fluctuations. As described above, the balancing force can be rendered to the test head during the rotation of the test head without fluctuations, so that the rotating operation of the test head can be facilitated.

4 Claims, 4 Drawing Sheets

WAFER PROBER

BACKGROUND OF THE INVENTION

1. Field of the Invention

This invention relates to a wafer prober, and more particularly to a wafer prober for inspecting electrical performance of a multiplicity of semiconductor element circuits formed on a semiconductor wafer.

2. Description of the Related Art

Semiconductor elements are produced so that a substantially disk-shaped thin sheet called a wafer is partitioned in a regular order longitudinally and latitudinally and a multiplicity of required electric element circuits identical with one another are formed in every partitions. Then, in the wafer formed thereon with the multiplicity of electric element circuits identical with one another, before cutting an element formed with an electric element circuit into a chips, the electric element circuits are inspected one after another by a semiconductor element inspecting device called a wafer prober, to thereby select and determine non-defective or defective. As shown in FIG. 3, this wafer prober 10 has a table 12. The table 12 is rested thereon with a wafer 14 and adapted to move horizontally in a direction X-Y and vertically in a direction Z in accordance with the arrangement of the plurality of electric element circuits formed on the wafer 14.

Furthermore, the wafer prober 10 is provided therein with a head stage 16 which is positioned upwardly from the table 12. The head stage 16 is secured thereto with a probe card 20 through a ring member 18. The probe card 20 is provided thereon with a plurality of probe needles 20A and 20B . . . , which are positioned at positions in association with respective electrodes of the electric element circuits to be inspected. As for this probe card 20, a probe card specialized for each type of the wafer 14 to be inspected should be prepared, and, in the specialized probe card, it is clearly indicated the type, mark and the like regarding the wafer 14 to be inspected. Accordingly, whenever the type of the wafer 14 to be inspected in changed, a specialized probe card should be secured to the ring member 18.

Further, the head stage 16 is provided with a test head 22 which is fixed thereto with an arm 24. The arm 24 is rotatably supported by a main body 28 of device through a shaft 26. A plurality of base plates are received in the test head 22. The plurality of base plates are electrically connected to a tester through a cable. These plurality of base plates are electrically connected to a performance board, not shown, which is detachably secured to the test head 22 through a holding frame 32. (Incidentally, the performance board can be detachably secured to the ring member 18).

Then, when the test head 22 is positioned at an inspecting position, the performance board is electrically connected to the probe card 20 through the ring member 18. With this arrangement, the tester is electrically connected to the probe card 20, and, when the probe needles 20A and 20B . . . are connected to the electrodes of the respective electric element circuits of the wafer 14, the tester inspects the respective electric element circuits.

Now, the shaft 26 is fixed thereto with a link 40, and a rod 42A of an air cylinder 42 is rotatably supported by the end portion of the link 40. Furthermore, a cylinder portion of the air cylinder 42 is rotatably supported by a main body 46 of device. Then, when the air is supplied to the air cylinder 42, the balancing force is rendered to the link 40, whereby the weight of the test head 22 is offset.

The balancing force of the air cylinder 42 will hereunder be described. In the relationship shown in FIG. 4, as viewed from the balancing between the moments, the following equation (1) will be established $$R = \frac{D \times W}{d} \cdot \frac{\cos\theta}{\cos\alpha} \quad (1)$$

where

R: the balancing force of the cylinder 42

D: the distance from the center of the shaft 26 to the position of the center of gravity of the test head 22

W: the weight of the test head 22 d: the length of the link 40

θ: the angle of rotation of the test head 22

α: the angle between the balancing force R of the cylinder 42 and the tangent line Furthermore, from the relationship of a triangle S consisting of $O_1$, $O_2$ and $O_3$ as shown in FIG. 4, the following equation (2) will be sought.

$$\frac{L}{\sin(90+\alpha)} = \frac{M}{\sin(90+\alpha)} \quad (2)$$

where

L: the distance between the pin 44 and the shaft 26

M: the length of the cylinder 42

The following equation (3) will be sought from the equations (1) and (2).

$$R = \frac{D \times W}{d} \cdot \frac{M}{L} \quad (3)$$

Further, from the relationship of the triangles S consisting of $O_1$, $O_2$ and $O_3$ as shown in FIG. 4, the following equation (4) will be sought.

$$M^2 = L^2 + d^2 - 2dL\cos(90-\theta) \quad (4)$$

From the equations (4) and (3), the following equation (5) indicating the balance force R of the air cylinder 42 will be sought.

$$R = \frac{D \times W}{d} \cdot \frac{1}{L} \cdot \sqrt{(L^2 + d^2 - 2dL\sin\theta)} \quad (5)$$

As shown in the equation (5), since the balancing force R of the cylinder 42 is represented by a function, the balancing force R of the cylinder 42 is fluctuated in association with the rotation angle θ of the test head 22.

When the balancing force R of the air cylinder 42 is fluctuated in association with the rotation angle θ of the test head 22 as described above, then, if a worker rotates the test head 22 upwardly, then the worker cannot rotate the test head 22 by an operating force of a predetermined value, whereby such a problem has been presented that the operation is difficult to do.

Furthermore, when the rotation angle θ of the test head 22 is changed, there is some angle at which the weight of the test head 22 cannot be offset by the balancing force of the air cylinder 42, so that such a problem has been presented that, in the case of this angle, the test head 22 cannot be balanced by the air cylinder 42.

To eliminate this problem, there is disclosed a device for maintaining the balancing force of the cylinder at a predetermined value without being influenced by the rotation angle of the test head (Japanese Patent Application Laid-open No.2-74050). However, this device of this Patent Application Laid-open has been constructed in such a way that the cylinder for balancing is moved by another cylinder in order to maintain the balancing force of the cylinder, so that such a problem has been presented that the construction becomes complicated.

SUMMARY OF THE INVENTION

The present invention has been developed to eliminate the above-described disadvantages and has as its object the provision of a wafer prober, in which the balance force of a cylinder is maintained at a predetermined value by a simple construction, whereby the rotating operation of a test head is made easy, so that the test head can be balanced by an air cylinder at all of the angles of rotation of the test head.

To achieve the above-described object, the present invention is characterized by comprising:

a main body of wafer prober;

a test head rotatably supported by the main body of wafer prober so as to be movable between an inspecting position electrically connected to a probe card supported on the side of the main body of wafer prober and provided with a plurality of probe needles and a retracted position being retracted from the inspecting position, for being in electrical contact with the probe card on the side of the main of wafer prober, to thereby inspect a semiconductor element; and a weight balance means having a cylinder for weight balance to decrease the tare of the test head during the rotation thereof between the inspecting position and the retracted position of the test head, for connecting the cylinder for weight balance to a connecting link, in order that the center of moving locus of a connecting point between the cylinder for weight balance and the connecting link provided on the opposite side of the center of rotation of the test head to the test head is made eccentric from the center of rotation of the test head.

According to the present invention, in order to decrease the tare of the test head between the inspecting position electrically connected to the probe card of the main body of device and the retracted position being retracted from the inspecting position, the cylinder for weight balance is connected to the connecting link provided on the opposite side of the center of rotation of the test head to the test head, whereby the center of rotation of the connecting point of this cylinder is made eccentric from the center of rotation of the test head. With this arrangement, the balancing force given by the cylinder to the connecting point is given to the test head in a predetermined state.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENT

Detailed description will hereunder be given of the preferred embodiment of a wafer prober according to the present invention with reference to accompanying drawings.

Figure 1:
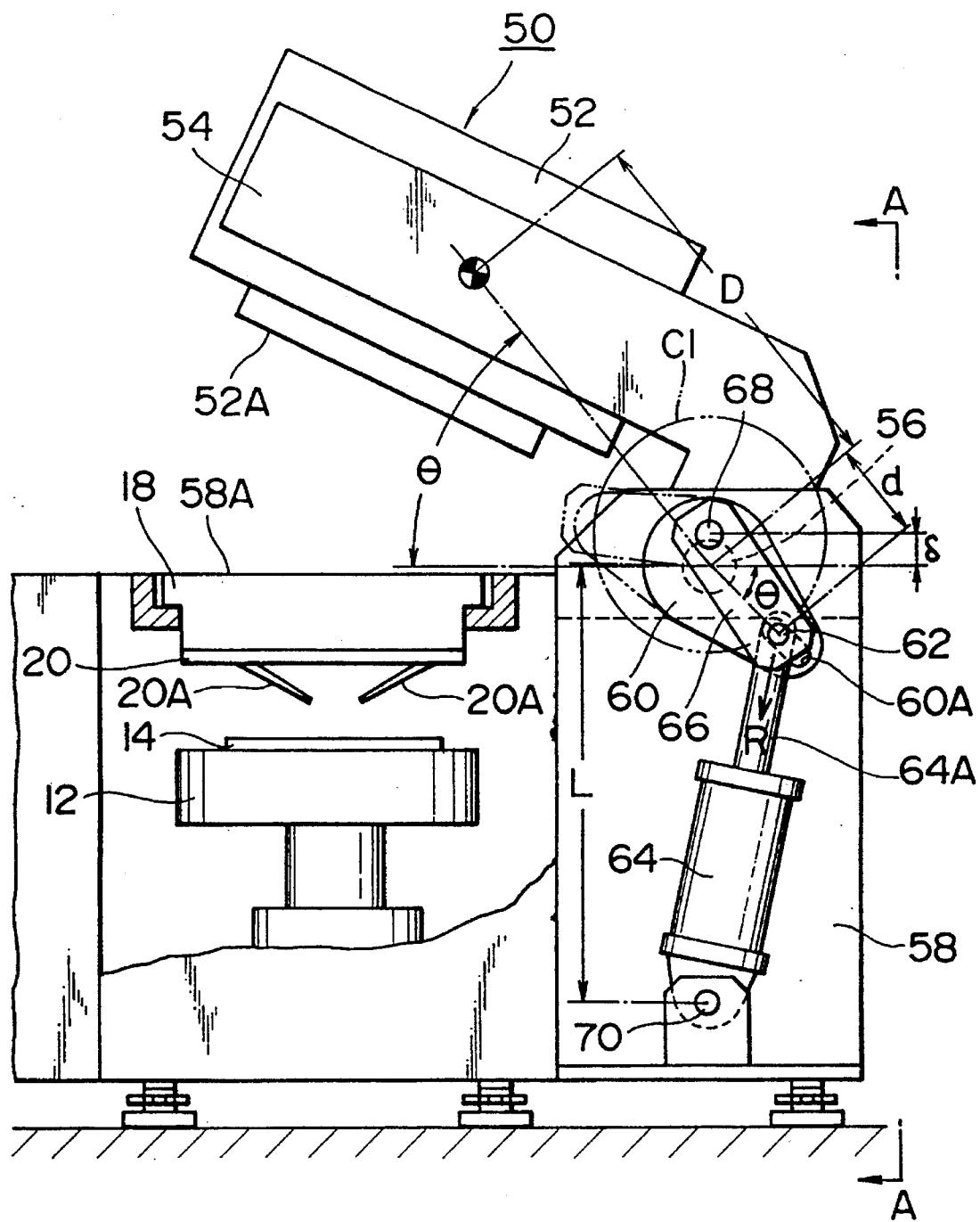
FIG. 1 is a side view showing the wafer prober according to the present invention.
Figure 2:
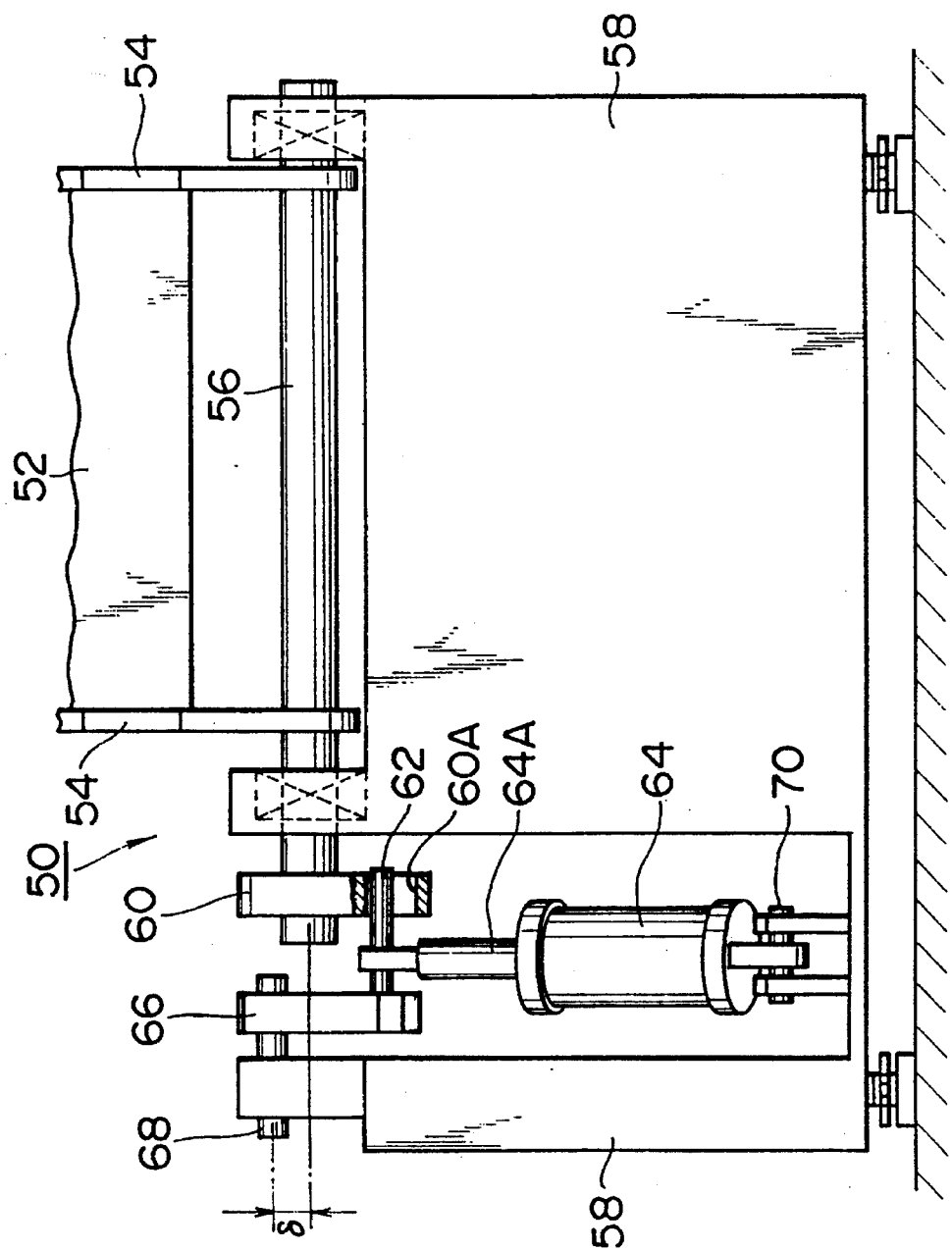
FIG. 2 is a view in the direction indicated by the arrows from the line A—A in FIG. 1.
Figure 3:
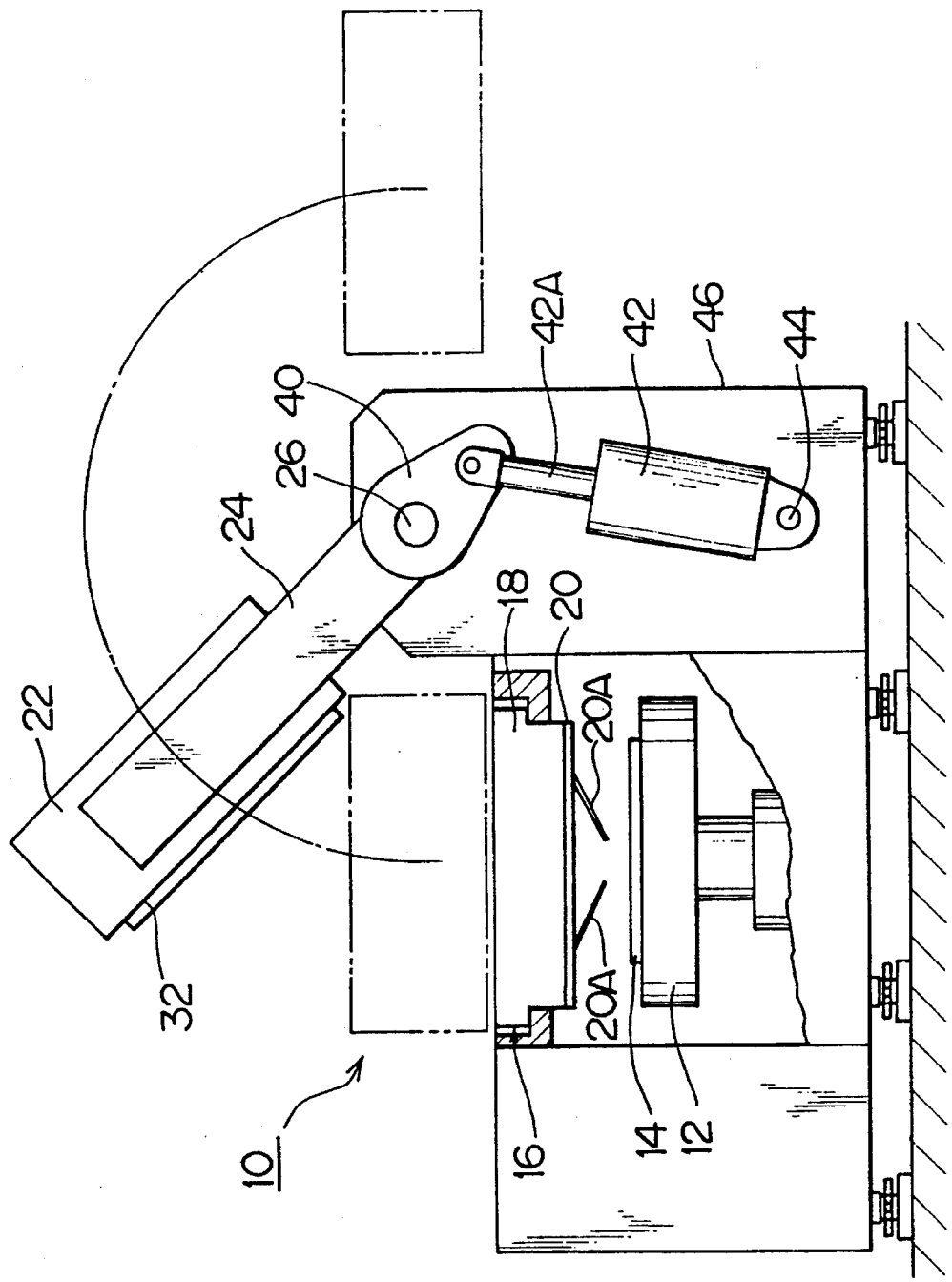
FIG. 3 is a side view showing the conventional wafer prober.
Figure 4:
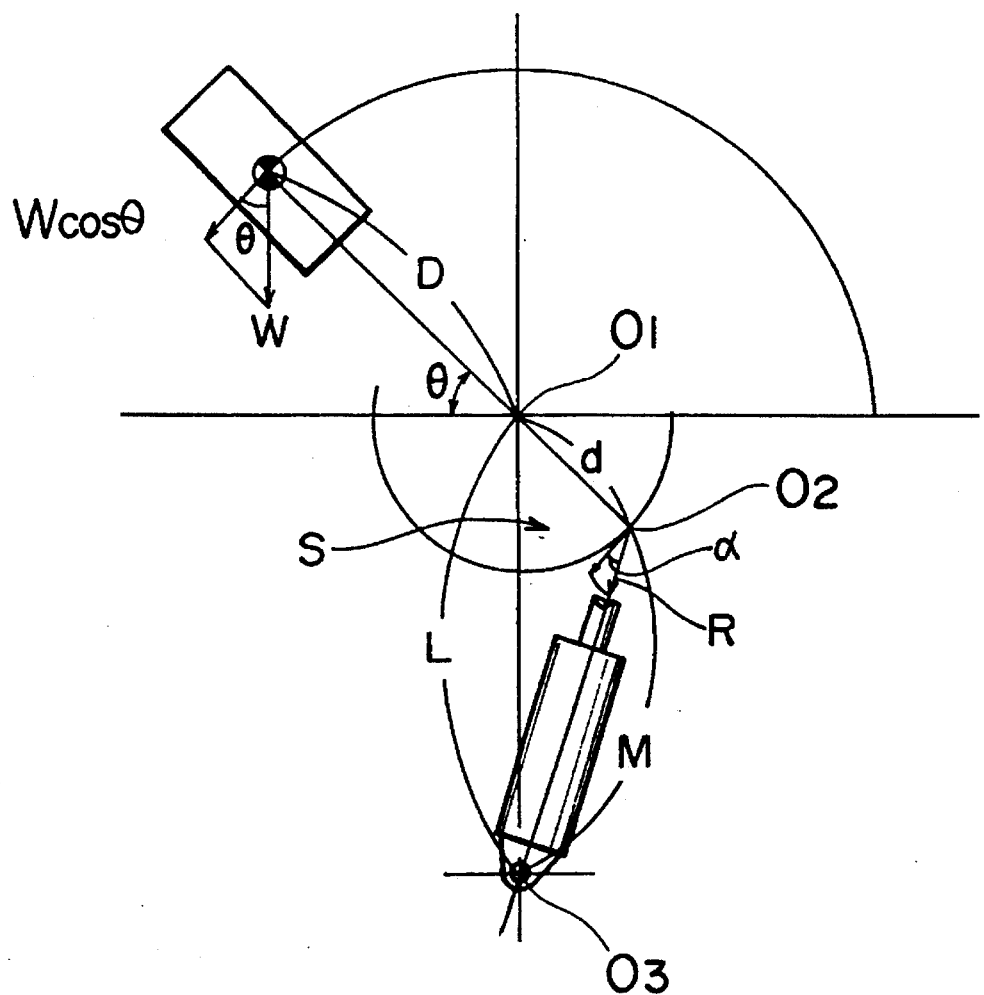
FIG. 4 is an explanatory view explaining the operations of the conventional wafer prober.

FIG. 1 is the side view showing the wafer prober according to the present invention, and FIG. 2 is the view in the direction indicated by the arrows from the line A—A in FIG. 1. As shown in FIG. 1, a test head 52 of a wafer prober 50 is fixed to an arm 54 which is rotatably supported by a main body 58 of device through a shaft 56. With this arrangement, the test head 52 is rotated between an inspecting position for electrically connecting the test head 52 to the probe card 20 and an exchanging position for attaching or detaching a performance board, not shown, of the test head 52. Here, the inspecting position is a position where a bottom end portion 52A of the test head 52 is rested on a top surface 58A of the main body 58 of device, and the exchanging position is a position where the test head 52 is rotated through 180° clockwise from the inspecting position.

A connecting link 60 is fixed to a left end portion of the shaft 56, and the connecting link 60 is formed at a forward end portion thereof with a slot 60A extending in the direction of the shaft 56. A pin 62 is movably inserted through the slot 60A, and the pin 62 is supported by a rod 64A of the air cylinder 64. Furthermore, the rod 64A is rotatably supported on one end portion of an eccentric link 66 through a pin 62. The eccentric link 66, is rotatably supported by the main body 58 of device through a pin 68, and the core of axis of the pin 68 is offset by a dimension δ upwardly from the core of axis of the shaft 56. Incidentally, the air cylinder 64 is rotatably supported by the main body 58 of device through a pin 70.

Accordingly, when the air pressure of a predetermined value is rendered to the air cylinder 64, a balancing force R of the air cylinder is imparted to the connecting link 60 through the pin 62 and the slot 60A. When the test head 52 is rotated from the inspecting position to the exchanging position in this state, the connecting link 60 is rotated about the shaft 56. However, the pin 62 moves in the slot 60A along a circularly arcuate portion C1 (Refer to FIG. 1) centered about the pin 68. That is, the pin 62 moves along the circularly arcuate portion centered about the eccentric position from the shaft 56.

Here, it is explained that, when the center of circularly motion of the pin 62 is offset by the dimension δ upwardly from the core of axis of the shaft 56, the balancing force R of the air cylinder 64 is not fluctuated in association with the angle of rotation θ of the test head 52. In the equation (5) of the conventional technique, in the case where a length d of the connecting link 60 is fluctuated without fluctuating the balancing force R of the air cylinder 64 in association with the angle of rotation θ of the test head 52, when a locus of d (i.e., a locus of the pin 62) is calculated, the locus represents the circularly arcuate portion C1 centered about the position which is offset by the dimension δ upwardly from the core axis of the shaft 56 (i.e., the core of axis of the pin 68).

The case of seeking an equation of the circularly arcuate portion C1 will hereunder be described. Firstly, the equation (5) will be plotted by an X - Y system of coordinates having the core of axis of the pin 68 as origin to seek the following equation (6).

$$\{1 - (R \cdot L/D \cdot W)^2\}(X^2 + Y^2) + 2LY + L^2 = 0 \tag{6}$$

where $$X = -d\cos\theta$$
$$= -d\sin\theta$$

Here, if the substitution of $(R \cdot L/D \cdot W)^2 - 1 = \beta$ is made, then the relationship of the following equation (7) will be established.

$$X^2 + \left(Y - \frac{L}{\beta}\right)^2 = \left\{\frac{L}{B}\sqrt{(1+\beta)}\right\}^2 \tag{7}$$

Further, in the equation (7), if the substitution of $$\frac{L}{\beta} = \delta$$

is made, then the following equation (8) will be established.

$$X^2 + (Y-\delta)^2 = \left\{\delta\sqrt{\left(1+\frac{L}{\delta}\right)}\right\}^2 \tag{8}$$

That is, the equation (8) represents the circularly arcuate portion C1 having a radius of $\delta\sqrt{(1+L/\delta)}$ which is centered about the position being eccentric by the dimension $\delta$ in the direction Y (Refer to FIG. 1).

Accordingly, when the core of axis of the pin 68 is offset by the dimension $\delta$ from the core of axis of the shaft 56 as described above and the length of the eccentric link 66 is set at $\delta\sqrt{(1+L/\delta)}$, the balancing force R of the air cylinder 64 is imparted to the connecting link 60 with no fluctuations.

As has been described hereinabove, in the wafer prober according to the present invention, in order to decrease the tare of the test head between the inspecting position electrically connected to the probe card of the main body of device and the retracted position being retracted from the inspecting position, the cylinder for weight balance is connected to the position on the opposite side of the center of rotation of the test head to the test head, and the center of rotation of the connecting point of this cylinder is made eccentric from the center of rotation of the test head. With this arrangement, the balancing force rendered to the connecting point by the cylinder is given to the test head in the predetermined state. Accordingly, the rotating operation of the test head is facilitated, and the test head can be balanced by the air cylinder at all of the angles of rotation of the test head.

Furthermore, the point, to which the balancing force of the cylinder is rendered, is merely set so as to move along the circularly arcuate portion centered about the position offset by the predetermined value from the center of rotation of the test head, so that the balancing force of the cylinder can be rendered to the test head in the predetermined state by the simple construction.

It should be understood, however, that there is no intention to limit the invention to the specific forms disclosed, but on the contrary, the invention is to cover all modifications, alternate constructions and equivalents falling within the spirit and scope of the invention as expressed in the appended claims.

I claim:

1. A wafer prober, comprising:

a main body;

a test head rotatably supported by the main body so as to be rotatable between an inspecting position in which the test head is electrically connected to a probe card to thereby inspect a semiconductor element, the probe card supported by the main body and provided thereon with a plurality of probe needles, and a retracted position in which the test head is retracted from the inspecting position; and weight balance means for decreasing the tare of the test head during the rotation thereof between the inspecting position and the retracted position having a cylinder for weight balance and means for connecting the cylinder for weight balance to a connecting link so that the center of moving locus of a connecting point between the cylinder for weight balance and the connecting link is made eccentric from the center of rotation of the test head.

2. A wafer prober as set forth in claim 1, wherein:

an eccentric value from the center of rotation of said test head to the center of the moving locus of said connecting point is made to be $\delta$;

a distance from the center of rotation of said cylinder for weight balance to the center of rotation of said test head is made to be L; and a distance from the center of the moving locus of said connecting point to said connecting point is set at $\delta\sqrt{(1+L/\delta)}$.

3. A wafer probe comprising:

a main body;

a test head rotatably supported by the main body so as to be rotatable between an inspecting position in which the test head is electrically connected to a probe card to thereby inspect a semiconductor element, the probe card supported by the main body and provided thereon with a plurality of probe needles, and a retracted position in which the test head is retracted from the inspecting position;

a connecting link;

an eccentric link made eccentric from a center of rotation of the test head and rotatably supported by the main body; and a cylinder for weight balance rotatably supported by the main body, movably connected at one end thereof to a slot formed in the connecting link through a pin, and rotatably connected to the eccentric link through the pin, the pin being rotated about the center of rotation of the eccentric link to decrease the tare of the test head during the rotation thereof between the inspecting position and the retracted position of the test head.

4. A wafer prober as set forth in claim 3, wherein:

an eccentric value from the center of rotation of said test head to the center of rotation of said eccentric link is made to be $\delta$;

a distance from the center of rotation of said cylinder for weight balance rotatably supported by said main body to the center of rotation of said test head is made to be L; and a distance from the center of rotation of said eccentric link to said pin is set at $\delta\sqrt{(1+L/\delta)}$.

* * * * *